United States Patent
Siddall (10) Patent No.: US 7,411,461 B2
(45) Date of Patent: Aug. 12, 2008

(54) FREQUENCY AND/OR PHASE LOCK LOOPS WITH BEAT FREQUENCY ESTIMATION

(75) Inventor: William Mark Siddall, Christchurch (NZ)

(73) Assignee: Tait Electronics Limited, Burnside, Christchurch (NZ)

(*) Notice: Subject to any disclaimer, the term of this patent is extended or adjusted under 35 U.S.C. 154(b) by 89 days.

(21) Appl. No.: 10/547,653

(22) PCT Filed: Mar. 4, 2004

(86) PCT No.: PCT/NZ2004/000043

§ 371 (c)(1),
(2), (4) Date: Oct. 16, 2006

(87) PCT Pub. No.: WO2004/079912

PCT Pub. Date: Sep. 16, 2004

(65) Prior Publication Data

US 2007/0035345 A1    Feb. 15, 2007

(30) Foreign Application Priority Data

Mar. 4, 2003    (NZ) .................................... 524537

(51) Int. Cl.
*H03L 7/00* (2006.01)

(52) U.S. Cl. .................... 331/1 R; 331/18; 331/34; 331/177 R; 331/37; 331/42; 331/40; 332/127; 327/156; 455/260; 375/376

(58) Field of Classification Search ............. 331/1 R, 331/18, 34, 177 R, 37, 42, 40; 327/156; 332/127; 375/376; 455/260
See application file for complete search history.

(56) References Cited

U.S. PATENT DOCUMENTS

| | | | | |
|---|---|---|---|---|
| 4,607,393 A | 8/1986 | Nolde et al. | ............... | 455/208 |
| 4,720,687 A | 1/1988 | Ostoich et al. | ............... | 331/1 A |
| 4,801,894 A | 1/1989 | Garner | ............... | 331/1 A |
| 4,856,085 A | 8/1989 | Horvat | ............... | 455/315 |
| 5,266,907 A | 11/1993 | Dacus | ............... | 331/1 A |
| 7,079,591 B2* | 7/2006 | Fling et al. | ............... | 375/316 |
| 2005/0186920 A1* | 8/2005 | Staszewski et al. | ...... | 455/114.1 |

FOREIGN PATENT DOCUMENTS

| | | |
|---|---|---|
| EP | 0402113 | 9/1995 |
| GB | 2333916 | 8/1999 |
| JP | 11233149 | 8/1999 |
| WO | 9907065 | 2/1999 |

OTHER PUBLICATIONS

S. Albrecht et al., "A Study Of Nonlinearities For A Frequency-Locked Loop Principle," South Symposium on Mixed-Signal Design, pp. 71-75 (2003).

*Primary Examiner*—Arnold Kinkead
(74) *Attorney, Agent, or Firm*—Dann, Dorfman, Herrell and Skillman, P.C.

* cited by examiner (57) ABSTRACT

A control loop (10) for producing an output signal with a stable nominal frequency is provided. The control loop includes inputs for reference (11) and oscillator (25) output signals, a beat frequency generator (12) for producing a signal with a frequency that is the difference between the oscillator and reference signal frequencies, an ADC (14) to convert the beat frequency to a digital beat frequency signal, an estimator (17) for estimating the frequency or phase of the beat signal, an adder (18) for combining an offset and modulation signal and the estimated frequency or phase of the beat signal into an added signal, and a DAC (23) for generating an analogue control signal for controlling the oscillator output frequency.

21 Claims, 3 Drawing Sheets

FREQUENCY AND/OR PHASE LOCK LOOPS WITH BEAT FREQUENCY ESTIMATION

FIELD OF THE INVENTION

The present invention relates to a frequency and/or phase lock loop, the output frequency of which can be adjusted to an arbitrarily fine resolution

BACKGROUND TO THE INVENTION

Control loops, in the form of frequency or phase lock loops (FLL/PLL), provide frequency adjustable output signals that are kept at a stable nominal frequency through a feedback arrangement. Such control loops are used in a range of telecommunications applications, for example in FM modulators, FM demodulators and frequency synthesisers.

The resolution of the adjustment of these control loops is often limited to relatively large discrete steps. For example, in an integer PLL with a fixed frequency reference signal, and a divider in the feedback path, the output frequency can only be adjusted to a multiple of the reference frequency by adjusting the divider value. Therefore, it is not possible to adjust the output frequency to an arbitrarily fine resolution. To increase the output frequency resolution, it is possible to use a divider that facilitates a larger division ratio in conjunction with a lower reference frequency. One of the drawbacks of this approach is that the smaller the reference frequency, the longer it takes the FLL/PLL to achieve lock.

One solution is to use a reference signal source that has an adjustable output frequency as an input to an integer or fractional N PLL. In this way the reference frequency can be increased by a small amount while coarse frequency adjustment in the integer N PLL is appropriate to achieve a fast phase lock time. The reference frequency source must be finely adjusted for the overall system to acquire frequencies between these coarse frequency steps caused by changing the dividers in the integer or fractional N PLL.

SUMMARY OF INVENTION

It is an object of the invention to provide a control loop with an oscillator that can produce an output frequency that is adjustable to an arbitrary level of precision. Arbitrary level of precision is intended to mean that the level of precision not limited by the reference frequency or divider characteristics. The quantisation level of the digital domain that the loop is implemented in may provide some fundamental limit, however. Such a device could be used in a range of purposes in telecommunications applications, or the like.

In broad terms in one aspect the invention comprises a control loop for producing an output signal with a stable nominal frequency including: inputs for reference and oscillator output signals, a beat frequency generator for producing a signal with a frequency that is the difference between the oscillator and reference signal frequencies, an ADC to convert the beat frequency to a digital beat frequency signal, an estimator for estimating the frequency or phase of the beat signal, an adder for combining an offset and modulation signal and the estimated frequency or phase of the beat signal into an added signal, a filter for generating a control signal from the added signal, and a DAC for generating an analogue control signal for controlling the oscillator output frequency.

Preferably the estimator is a frequency estimator that generates an error signal indicating the difference in frequency between the oscillator signal and reference signal. Alternatively, the estimator is a phase estimator, which generates an error signal indicating the difference in phase between the oscillator and reference signals.

BRIEF LIST OF FIGURES

Preferred embodiments of the invention will be described with reference to the accompanying drawing, of which.

DETAILED DESCRIPTION OF THE PREFERRED EMBODIMENTS

It will be appreciated that phase and frequency lock loops according to the invention can be implemented in various forms. The following embodiments are provided by way of example only. It will be appreciated that the invention can be utilised in a range of applications. Those applications described here are examples, but should not be considered exhaustive. The function of existing frequency and phase lock loops will be known to those skilled in this area of technology, and will therefore not be described in detail here.

Figure 1:
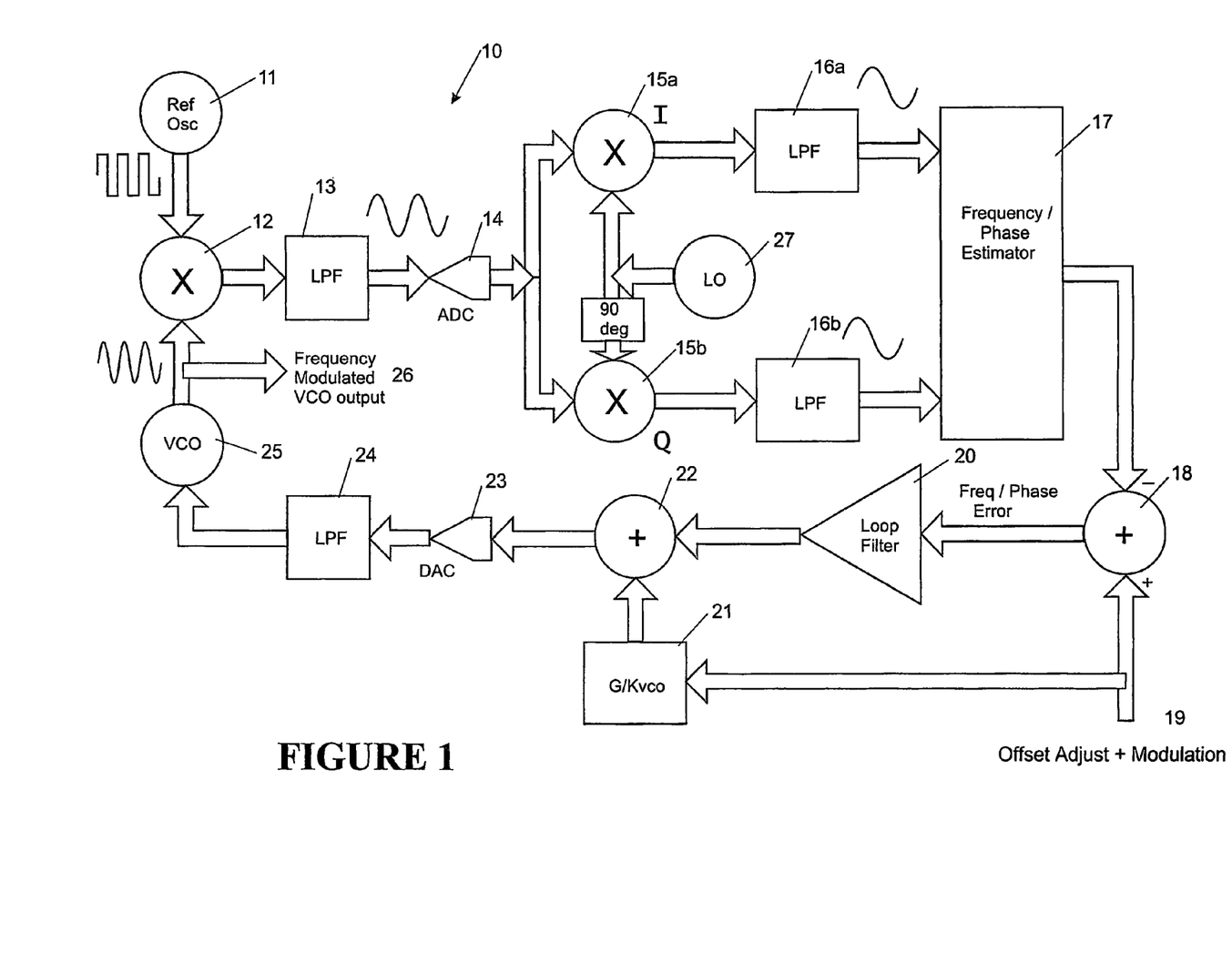
FIG. 1 is a block diagram of a frequency lock loop adjustable to an arbitrarily fine output frequency resolution, according to the invention.

FIG. 1 shows a block diagram of a preferred embodiment of a control lock loop 10 according to the invention. It is adapted to provide a modulatable output frequency, adjustable to an arbitrarily fine frequency resolution, while retaining a stable programmable frequency. The control loop 10 can readily be adapted to function as a frequency lock loop (FLL) or a phase lock loop (PLL), as will be described below. The FLL automatically locks the desired frequency of an output signal to a reference signal using a feedback loop and an error signal indicating the difference in frequency between the output signal and reference signal. A PLL locks the output frequency in a similar manner, but instead using an error signal indicating the difference in phase between the reference and output signals. The FLL embodiment will be described first.

The FLL 10 includes a stable reference frequency oscillator 11, which can be a temperature compensated crystal oscillator (TCXO), oven controlled crystal oscillator (OCXO) or some other suitable stable reference frequency source. The reference oscillator 11 may be an analogue oscillator and may produce a sine wave, clipped sine wave, square wave, or any other suitable reference signal. The characteristics of the signal produced by the reference oscillator may be dictated by the type of mixer used to mix the reference oscillator and VCO signals. The reference signal from the source 11 is fed into a mixer 12, which also receives an output signal from an oscillator, such as a voltage-controlled oscillator (VCO) 25. Alternatively, this may be a voltage controlled crystal oscillator (VCXO), voltage controlled ceramic oscillator (VCCO), voltage controlled LC or RC oscillator or other adjustable signal source. Preferably the mixer 12, as shown in FIG. 1, is an analogue mixer that mixes the reference oscillator 11 signal and VCO 25 signal down to a frequency suitable for digitising by the ADC. In preferred embodiments this frequency is ¼ of the ADC 14 sample frequency. The mixed signal produces an output with at a difference (beat) frequency of the two input signal frequencies. Preferably, the beat frequency occupies the minimum possible amount of spectrum, which enables digitisation of the difference frequency while minimising distortion. To assist, the output from the mixer 12 is passed to a first low pass filter (LPF) 13, which reduces the bandwidth occupied by the signal by filtering off high frequency noise and harmonics. The difference frequency is chosen to be suitably low in frequency to enable an analogue-to-digital converter (ADC) 14 or codec to convert the analogue beat frequency signal into the digital domain. At frequencies below 20 kHz, a low-cost sigma-delta ADC can be used.

As shown in FIG. 1, the digitised difference signal is split into quadrature I and Q components, by mixers 15a, 15b driven by a phase quadrature local oscillator (LO) 27, down to nominally 0 Hz. The LO signal passes through a 90° phase shifter, prior to entering the Q mixer 15b. Preferably, to simplify implementation, the generation of the quadrature LO, and the complex mixing process, the LO frequency is chosen to be ¼ of the ADC 14 sample rate.

The mixed signals are filtered in respective LPFs 16a, 16b, and then passed to a frequency estimator 17, which calculates or otherwise determines the frequency of the beat frequency signal, using the I and Q components of the digitised beat frequency signal. The frequency estimator 17 may implement any suitable estimation technique known to those skilled in the art, or alternatively, as disclosed in PCT/NZ2004/000035"Improvements Relating to Frequency Estimation" filed by Tait Electronics Ltd on 24 February 2004, which is incorporated herein by reference. The frequency estimator outputs a value that indicates the (signed) difference in frequency between the VCO 25 output signal and the reference source 11 signal and the local oscillator 27. This is passed to an adder 18, where a modulation signal 19 can be applied and an error signal created, to modulate VCO 25. This enables modulation down to dc, such that a dc signal can be added to the error signal to generate a desired constant frequency offset in the VCO 25 output signal. In this manner, the output frequency can be adjusted to an arbitrarily fine resolution. The modulating signal can have a frequency of up to the DAC 23 upper frequency limit.

In preferred embodiments the frequency of the reference oscillator and the frequency of the voltage controlled oscillator are kept apart. Preferably this frequency different is at least 7 kHz. This arrangement prevents a "dead zone" due to injection locking occurring, which can be a problem in existing FLLs. This is where the VCO and reference signal will "lock" when the frequencies are very close. The present invention does not suffer from this drawback, as a frequency difference between the reference oscillator and VCO is always maintained.

The error signal is integrated in a loop filter 20, to generate a digital control voltage for adjusting the VCO. The loop filter 20 is designed to provide the desired characteristics of the control loop, and meet the classical loop stability criteria. As the loop filter 20 is implemented in the digital domain, the loop parameters can be changed in real-time to optimise speed and/or noise performance, as required. If required, the filtered signal may be dual point modulated at adder 22 by the modulation signal attenuated by G/Kvco 21 where G is scale factor and KVCO is the modulating gain of the VCO. The loop filter gain constant and can be adjusted at any time. The ease of adjusting the loop filter gain provides advantages of lower lock times or higher lock times with lower noise. The modulation scaling Kvco can also be changed at any time. Dual point modulation allows the modulation to be independent of the loop bandwidth. The modulated control signal is converted back to the analogue domain by a digital-to-analogue converter (DAC) 23. The analogue signal is filtered in LPF 24 to remove undesirable high frequency components generated in the digital-to-analogue conversion process, and then passed to the input of the VCO 25. The modulated output of the VCO 25 is then utilised, as required at Frequency modulated VCO output 26 (eg used as a modulated reference frequency input to an integer PLL system).

For example the reference oscillator 11 is set at 15 MHz. The VCO 25 provides a signal at a nominal 15.010 MHz. These are mixed at mixer 12 and low pass filtered at low pass filter 13 to produce a beat frequency of 10 kHz. The ideal sample frequency for ADC 14 would be 40 kHz and in this example the ADC is set to this sample frequency. The beat frequency is digitised at ADC 14.

The frequency of local oscillator 27 is set to ¼ of the ADC sampling frequency. In this example the local oscillator frequency is 10 kHz. The local oscillator is mixed at the I and Q mixers 15a and 15b to mix the beat signal down to nominal 0 Hz. The I and Q signals are then low pass filtered at low pass filters 16a and 16b respectively. Low pass filters 16a and 16b remove any extraneous high frequencies from the I and Q signals. The I and Q signals are then passed to the frequency estimator that determines the frequency of the I and Q components. In this case the frequency offset estimator estimates the frequency offset as 0 Hz. This result is passed to adder 18 where it is subtracted from any offset adjust and modulation signal. The result is then passed to loop filter 20 where it is integrated. As there is no error present the integration results in a zero change to its output. The output of the loop filter is passed to adder 22 where an attenuated modulation signal is added. The output of adder 22 is then converted into an analogue signal at DAC 23 and low pass filtered at low pass filter 24 to remove any extraneous high frequency noise. The low pass filtered signal is then used to control VCO 25.

For example an offset can be applied to the input of adder 18. If 5000 Hz is added by offset adjust and modulation 19 the action of the control loop increases the VCO 25 output to 15.015 MHz. This is mixed with the reference oscillator 15 MHz at mixer 12, to produce a difference at 15 kHz which is then low pass filtered and digitised by low pass filter 13 and ADC 14 respectively. This signal is split and mixed by local oscillator 27 at mixers 15a and 15b. The local oscillator is set at 10 kHz and mixing the beat signal (15 kHz) and the local oscillator signal (10 kHz) produces a difference of 5 kHz. This is fed into frequency offset estimator 117 and estimated. The estimator estimates the offset as 5 kHz which is subtracted from the modulation signal 19 at adder 18. This produces a 0 Hz result which is fed into the loop filter and when integrated by loop filter 20 produces no change to its output. Hence the loop is locked with a 5 kHz offset applied to the VCO's nominal frequency.

The above example provides an example of the frequency lock loop in operation. This example is not intended to limit the scope of the invention in any way.

Figure 2:
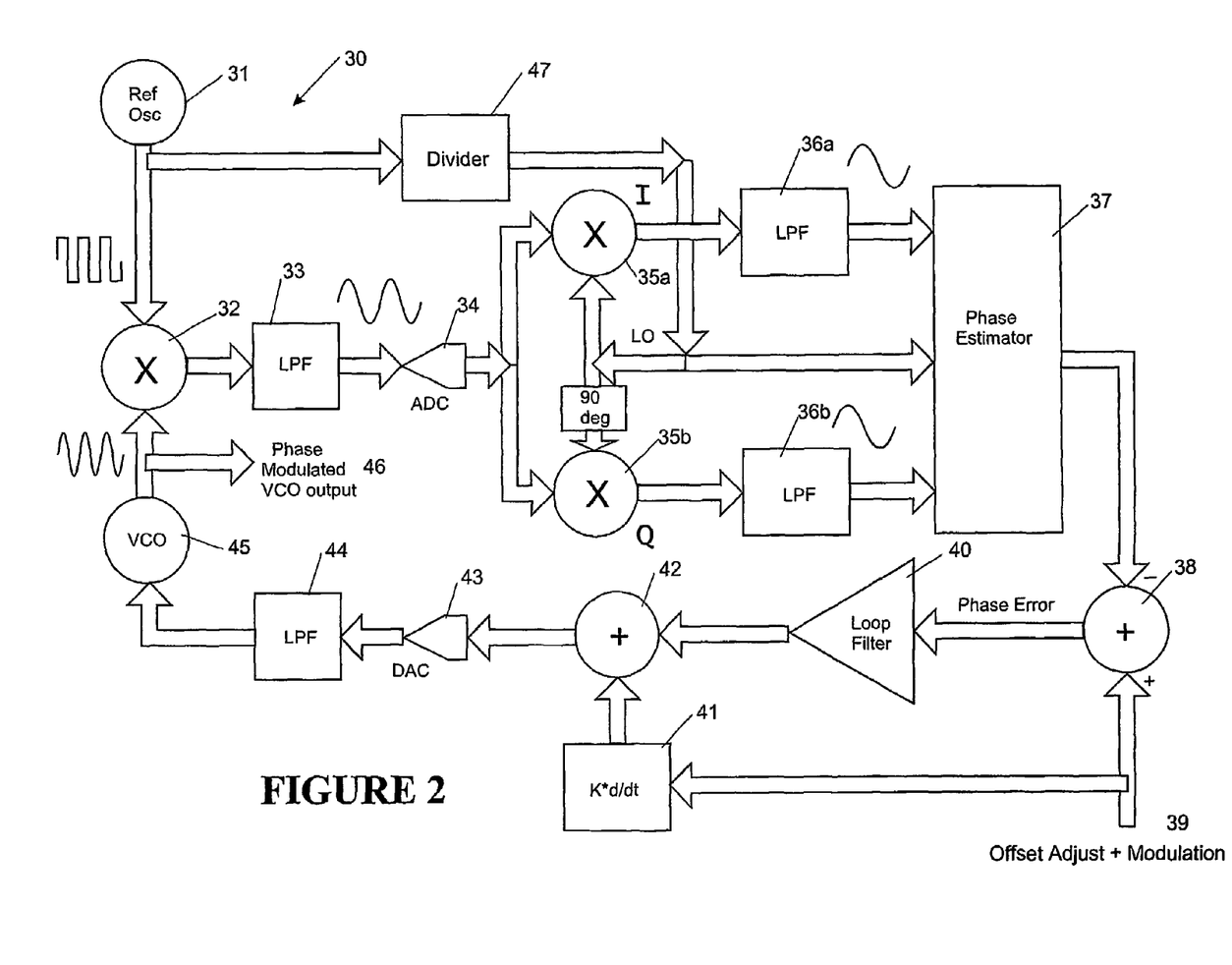
FIG. 2 is a block diagram of a phase lock loop adjustable to an arbitrarily fine output phase resolution, according to the invention.

The control loop shown in FIG. 1 can be adapted to function as a phase lock loop instead as shown in FIG. 2. In this alternative embodiment, the frequency estimator is replaced with a phase estimator, which unlike convention "simple" phase detectors can have a complete 360 degree range of operation. In this case, the control loop adjusts the VCO phase based on a phase error between the output signal and input signal.

FIG. 2 shows a block diagram of a preferred embodiment phase lock loop 30 of the invention. The PLL 30 includes a stable reference frequency oscillator 31, which can be a temperature compensated crystal oscillator (TCXO), oven controlled crystal oscillator (OCXO) or some other suitable stable reference frequency source. The reference oscillator 31 may be an analogue oscillator and may produce a sine wave, clipped sine wave, square wave, or any other suitable reference signal. The characteristics of the signal produced by the reference oscillator may be dictated by the type of mixer used to mix the reference oscillator and VCO signals. The reference signal from the source 31 is fed into a mixer 32, which also receives an output signal from an oscillator, such as a voltage-controlled oscillator (VCO) 45. Alternatively, this may be a voltage controlled crystal oscillator (VCXO), voltage controlled ceramic oscillator (VCCO), voltage controlled LC or RC oscillator or other adjustable signal source.

Preferably the mixer 32, as shown in FIG. 2, is an analogue mixer that mixes the reference oscillator 31 signal and VCO 45 signal down to a frequency suitable for digitising by the ADC. In preferred embodiments this frequency is ¼ of the ADC 34 sample frequency. The mixed signal produces an output with at a difference (beat) frequency of the two input signal frequencies. Preferably, the beat frequency occupies the minimum possible amount of spectrum, which enables digitisation of the difference frequency while minimising distortion. To assist, the output from the mixer 32 is passed to a first low pass filter (LPF) 33, which reduces the bandwidth occupied by the signal by filtering off high frequency noise and harmonics. The difference frequency is chosen to be suitably low in frequency to enable an analogue-to-digital converter (ADC) 34 or codec to convert the analogue beat frequency signal into the digital domain. For example, at frequencies below 20 kHz, a low-cost sigma-delta ADC can be used.

As shown in FIG. 2, the digital difference signal is split into quadrature I and Q components, by quadrature mixers 35a, 35b. The signal is quadrature mixed by respective mixers 35a, 35b with a signal from a divider 47, down to nominally 0 Hz. The divider signal is divided from the reference oscillator 31 to provide a reference signal to the phase estimator 37 as well as a local oscillator signal. The divider may accept an analogue signal from reference oscillator 31 or may be preceded by an ADC if required. The divider signal passes through a 90° phase shifter, prior to entering the Q mixer 35b. Preferably, to simplify implementation, the generation of the quadrature signal, and the complex mixing process, the divider frequency is chosen to be ¼ of the ADC 34 sample rate. The divider 47 signal has the same phase as the reference oscillator 31 signal.

The mixed signals are filtered in respective LPFs 36a, 36b, and then passed to a phase estimator 37, which calculates or otherwise determines the phase of the beat frequency signal, using the I and Q components of the digitised beat frequency signal and the local oscillator from the divider. The phase estimator 37 may implement any suitable phase estimation technique known to those skilled in the art. The phase estimator outputs a signal, the amplitude of which indicates the difference in phase between the VCO 45 output signal and the reference source 31 signal and the divider 47. This is passed to an adder 38, where a phase offset adjusted and modulation signal 39 can be applied and an error signal created, to modulate the VCO 45. This enables modulation down to dc, such that a dc signal can be added to the error signal to generate a desired constant phase offset in the VCO 45 output signal. In this manner, the output phase can be adjusted to an arbitrarily fine resolution. The modulating signal can have a frequency of up to the DAC 23 upper frequency limit.

In preferred embodiments the frequency of the reference oscillator and the frequency of the voltage controlled oscillator are kept apart. Preferably this frequency different is at least 7 kHz. This arrangement prevents a "dead zone" due to injection locking occurring, which can be a problem in existing PLLs. This is where the VCO and reference signal will "lock" when the frequencies are very close. The present invention does not suffer from this drawback, as a frequency difference between the reference oscillator and VCO is always maintained.

The error signal is integrated in a loop filter 40, to generate a digital control voltage for adjusting the VCO 45. The loop filter 40 is designed to provide the desired characteristics of the control loop, and meet the classical loop stability criteria. The loop filter design of the phase lock loop will differ from that of the frequency lock loop due to the system transfer function. As the loop filter 40 is implemented in the digital domain, the loop parameters can be changed in real-time to optimise speed and/or noise performance, as required. If required, the filtered signal may be dual point modulated at adder 42 by the modulation signal attenuated by scalar K 41. The loop filter gain constant and can be adjusted at any time. The ease of adjusting the loop filter gain provides advantages of lower lock times or higher lock times with lower noise. The modulation scaling K can also be changed at any time. Dual point modulation allows the modulation to be independent of the loop bandwidth. The modulated control signal is converted back to the analogue domain by a digital-to-analogue converter (DAC) 43. The analogue signal is filtered in LPF 44 to remove undesirable high frequency components generated in the digital-to-analogue conversion process, and then passed to the input of the VCO 45. The modulated output of the VCO 45 is then utilised, as required at Phase modulated VCO output 46 (eg used as a modulated reference frequency input to an integer PLL system).

The control loop can be used in a range of applications. For example, it can be used as a stable reference source, which is phase adjustable to an arbitrarily fine resolution, for another FLL or PLL, or in any other application where a reference signal is required. It can also be used as basis for a phase modulator or demodulator. For example, FIG. 2 includes details of how a dual point modulation scheme could be implemented using the PLL, where the modulation frequency response is not limited by the time constant of the control loop 30.

The control loop can be used in any application that requires a finely programmable phase adjusted oscillator which can be phase modulated. Examples of uses include HF radios, VHF, UHF mobile and cellular radios, and any integer N or fractional N synthesiser system.

An extension of either the frequency or phase locked loops is to add amplitude modulation capability, thus providing full polar modulation. In this embodiment the frequency or phase estimator can be arranged to also measure the amplitude of the input in-phase and quadrature signals and compare this with the input amplitude modulation. The difference between these two signals can then be output through a DAC and LPF and by a suitable means amplitude scale the VCO output.

Figure 3:
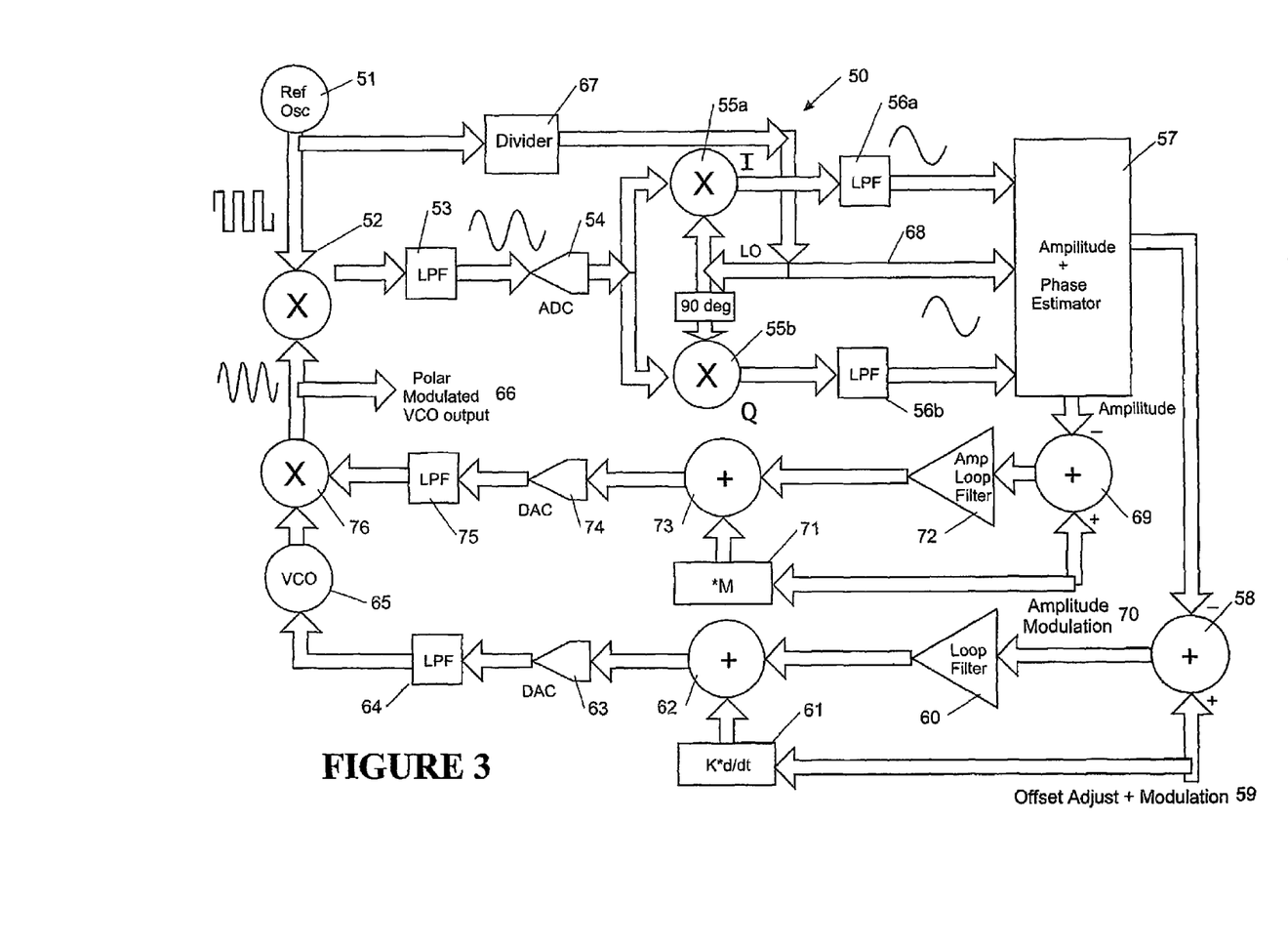
FIG. 3 is a block diagram of a phase lock loop and amplitude modulation system, according to the invention.

FIG. 3 shows an embodiment of a phase lock loop with amplitude modulation capability. The PLL and amplitude modulator 50 includes a stable reference frequency oscillator 51, which can be a temperature compensated crystal oscillator (TCXO), oven controlled crystal oscillator (OCXO) or some other suitable stable reference frequency source. The reference oscillator 51 may be an analogue oscillator and may produce a sine wave, clipped sine wave, square wave, or any other suitable reference signal. The characteristics of the signal produced by the reference oscillator may be dictated by the type of mixer used to mix the reference oscillator and VCO signals. The reference signal from the source 51 is fed into a mixer 52, which also receives an output signal from an oscillator, such as a voltage-controlled oscillator (VCO) 65. Alternatively, this may be a voltage controlled crystal oscillator (VCXO), voltage controlled ceramic oscillator (VCCO), voltage controlled LC or RC oscillator or other adjustable signal source.

Preferably the mixer 52, as shown in FIG. 3, is an analogue mixer that mixes the reference oscillator 51 signal and VCO 65 signal down to a frequency suitable for digitising by the ADC. In preferred embodiments this frequency is ¼ of the ADC 54 sample frequency. The mixed signal produces an output with at a difference (beat) frequency of the two input signal frequencies. Preferably, the beat frequency occupies the minimum possible amount of spectrum, which enables digitisation of the difference frequency while minimising distortion. To assist, the output from the mixer 52 is passed to a first low pass filter (LPF) 53, which reduces the bandwidth occupied by the signal by filtering off high frequency noise and harmonics. The difference frequency is chosen to be suitably low in frequency to enable an analogue-to-digital converter (ADC) 54 or codec to convert the analogue beat frequency signal into the digital domain. For example, at frequencies below 20 kHz, a low-cost sigma-delta ADC can be used.

As shown in FIG. 3, the digital difference signal is split into quadrature I and Q components, by quadrature mixers 55a, 55b. The signal is quadrature mixed by respective mixers 55a, 55b with a signal from a divider 67, down to nominally 0 Hz. The divider signal is divided from the reference oscillator 51 to provide a reference signal to the phase and amplitude estimator 57 as well as a local oscillator signal. The divider may accept an analogue signal from reference oscillator 51 or may be preceded by an ADC if required. The divider signal passes through a 90° phase shifter, prior to entering the Q mixer 55b. Preferably, to simplify implementation, the generation of the quadrature signal, and the complex mixing process, the divider frequency is chosen to be ¼ of the ADC 54 sample rate. The divider 67 signal has the same phase as the reference oscillator 51 signal.

The mixed signals are filtered in respective LPFs 56a, 56b, and then passed to a phase and amplitude estimator 57, which calculates or otherwise determines the phase of the beat frequency signal, using the I and Q components of the digitised beat frequency signal and the local oscillator from the divider. The phase and amplitude estimator 57 may implement any suitable phase estimation technique known to those skilled in the art. The phase and amplitude estimator also estimates the amplitude of the I and Q signals. The phase and amplitude estimator outputs a signal, the amplitude of which indicates the difference in phase between the VCO 65 output signal and the reference source 51 signal and the divider 67. This is passed to an adder 58, where a phase offset adjusted and modulation signal 59 can be applied and an error signal created, to modulate the VCO 65. This enables modulation down to dc, such that a dc signal can be added to the error signal to generate a desired constant phase offset in the VCO 65 output signal. In this manner, the output phase can be adjusted to an arbitrarily fine resolution. The modulating signal can have a frequency of up to the DAC 63 upper frequency limit.

In preferred embodiments the frequency of the reference oscillator and the frequency of the voltage controlled oscillator are kept apart. Preferably this frequency different is at least 7 kHz. This arrangement prevents a "dead zone" due to injection locking occurring, which can be a problem in existing PLLs. This is where the VCO and reference signal will "lock" when the frequencies are very close. The present invention does not suffer from this drawback, as a frequency difference between the reference oscillator and VCO is always maintained.

The error signal is integrated in a loop filter 60, to generate a digital control voltage for adjusting the VCO 65. The loop filter 60 is designed to provide the desired characteristics of the control loop, and meet the classical loop stability criteria. The loop filter design of the phase lock loop will differ from that of the frequency lock loop due to the system transfer function. As the loop filter 60 is implemented in the digital domain, the loop parameters can be changed in real-time to optimise speed and/or noise performance, as required. If required, the filtered signal may be dual point modulated at adder 62 by the modulation signal attenuated by scalar K 61. The loop filter gain constant and can be adjusted at any time. The ease of adjusting the loop filter gain provides advantages of lower lock times or higher lock times with lower noise. The modulation scaling K can also be changed at any time. Dual point modulation allows the modulation to be independent of the loop bandwidth. The modulated control signal is converted back to the analogue domain by a digital-to-analogue converter (DAC) 63. The analogue signal is filtered in LPF 64 to remove undesirable high frequency components generated in the digital-to-analogue conversion process, and then passed to the input of the VCO 65. The modulated output of the VCO 65 is then utilised, as required at Phase modulated VCO output 66 (eg used as a modulated reference frequency input to an integer PLL system).

The amplitude and phase estimator 57 also produces an output of the amplitude of the I and Q signals. The difference between the amplitude determined by amplitude and phase estimator 57 and amplitude modulation 70 is formed at adder 69. This difference is then passed through loop filter 72 and added to loop gain 71 at adder 73.

The sum from adder 73 is converted to an analogue signal at DAC 74 and then low pass filtered to remove any high frequency noise at low pass filter 75. The output from the low pass filter is then mixed with the VCO 65 output at mixer 76 to produce a signal that can be both phase and amplitude modulated. This polar modulated signal can be outputted at polar modulated VCO output 66.

A frequency and amplitude modulated signal can also be provided by combining the frequency lock loop of the invention with the amplitude modulation portions of FIG. 3.

The foregoing describes the invention including preferred forms thereof. Alterations and modifications as will be obvious to those skilled in the art are intended to be incorporated in the scope hereof as defined by the accompanying claims.

The invention claimed is:

1. A control ioop for producing an output signal with a stable nominal frequency comprising:
   inputs for reference and oscillator output signals,
   a beat frequency generator for producing a beat signal with a frequency that is the difference between the oscillator and output signal reference signal frequencies,
   an ADC to convert the frequency of the beat signal to a digital beat frequency signal,
   an estimator for estimating the frequency or phase of the beat signal,
   an adder for combining an offset and modulation signal with the estimated frequency or phase of the beat signal into an added signal,
   a filter for generating a control signal from the added signal, and
   a DAC for generating an analogue control signal for controlling the oscillator output frequency from the control signal.

2. A control loop for producing an output signal with a stable nominal frequency as claimed in claim 1 wherein the estimator is a frequency estimator that generates an error signal indicating the difference in frequency between the oscillator output signal and reference signal.

3. A control loop for producing an output signal with a stable nominal frequency as claimed in claim 1 wherein the estimator is a phase estimator that generates an error signal indicating the difference in phase between the oscillator output signal and reference signal.

4. A control ioop for producing an output signal with a stable nominal frequency as claimed in claim 1 wherein the reference signal is provided by a temperature controlled crystal oscillator.

5. A control loop for producing an output signal with a stable nominal frequency as claimed in claim 1 wherein the reference signal is provided by an oven controlled crystal oscillator.

6. A control loop for producing an output signal with a stable nominal frequency as claimed in claim 1 wherein the oscillator output signal is provided by a voltage controlled oscillator.

7. A control loop for producing an output signal with a stable nominal frequency as claimed in claim 1 wherein the oscillator output signal is provided by a voltage controlled crystal oscillator.

8. A control loop for producing an output signal with a stable nominal frequency as claimed in claim 1 wherein the oscillator output signal is provided by a voltage controlled ceramic oscillator.

9. A control loop for producing an output signal with a stable nominal frequency as claimed in claim 1 wherein the oscillator output signal is provided by a voltage controlled LC oscillator.

10. A control loop for producing an output signal with a stable nominal frequency as claimed in claim 1 wherein the oscillator output signal is provided by a voltage controlled RC oscillator.

11. A control loop for producing an output signal with a stable nominal frequency as claimed in claim 1 wherein the beat frequency generator mixes the reference signal and the oscillator output signal down to a frequency suitable for digitising by the ADC.

12. A control loop for producing an output signal with a stable nominal frequency as claimed in claim 1 wherein the control loop includes a low pass filter between the beat frequency generator and the ADC to filter out high frequency noise and harmonics.

13. A control loop for producing an output signal with a stable nominal frequency as claimed in claim 1 wherein the digital beat frequency signal is split into in-phase and quadrature components by mixing the digital beat frequency signal with a local oscillator signal to form the in-phase signal and with the local oscillator signal phase shifted by 90 degrees to form the quadrature signal.

14. A control loop for producing an output signal with a stable nominal frequency as claimed in claim 13 wherein the local oscillator signal frequency is ¼ of the ADC sample frequency.

15. A control loop for producing an output signal with a stable nominal frequency as claimed in claim 1 wherein the amplitude of the signal produced by the frequency estimator indicates the frequency difference between the reference frequency and oscillator signals.

16. A control loop for producing an output signal with a stable nominal frequency as claimed in claim 1 wherein the output of the frequency estimator is added to a modulation signal.

17. A control loop for producing an output signal with a stable nominal frequency as claimed in claim 16 wherein the modulation signal can be any frequency down to DC.

18. A control loop for producing an output signal with a stable nominal frequency as claimed in claim 2 further comprising an adder between the filter and the DAC at which the modulation signal can be added to the error signal.

19. A control loop for producing an output signal with a stable nominal frequency as claimed in claim 1 wherein the analogue control signal from the DAC is low pass filtered.

20. A control loop for producing an output signal with a stable nominal frequency as claimed in claim 1 wherein the frequency of the reference signal is kept at least a set frequency apart from the VCO frequency.

21. A control loop for producing an output signal with a stable nominal frequency as claimed in claim 1 further comprising an amplitude estimator in the estimator, an adder for combining an amplitude offset and modulation signal with the estimated amplitude of the beat signal into an added signal, a filter for generating a control signal from the added signal, and a DAC for generating an analogue control signal for controlling the oscillator output amplitude from the control signal.

* * * * *

UNITED STATES PATENT AND TRADEMARK OFFICE
CERTIFICATE OF CORRECTION

| | | |
|---|---|---|
| PATENT NO. | : 7,411,461 B2 | Page 1 of 1 |
| APPLICATION NO. | : 10/547653 | |
| DATED | : August 12, 2008 | |
| INVENTOR(S) | : Siddall | |

It is certified that error appears in the above-identified patent and that said Letters Patent is hereby corrected as shown below:

On the title page item (54) and col. 1, line 1, change the title to read -- Frequency and/or Phase Lock Loops --

Claim 1, line 1, change "ioop" to read -- loop --
    Claim 4, line 1, change "ioop" to read -- loop --

Signed and Sealed this
Eighth Day of May, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,411,461 B2 | Page 1 of 1 |
| APPLICATION NO. | : 10/547653 | |
| DATED | : August 12, 2008 | |
| INVENTOR(S) | : Siddall | |

It is certified that error appears in the above-identified patent and that said Letters Patent is hereby corrected as shown below:

On the title page item (54) and col. 1, line 1, change the title to read -- Frequency and/or Phase Lock Loops --

Column 8, line 47 (Claim 1, line 1) change "ioop" to read -- loop --
    Column 9, line 8 (Claim 4, line 1) change "ioop" to read -- loop --

This certificate supersedes the Certificate of Correction issued May 8, 2012.

Signed and Sealed this
Twelfth Day of June, 2012

David J. Kappos
*Director of the United States Patent and Trademark Office*